United States Patent [19]

Lape et al.

[11] Patent Number: 4,817,273
[45] Date of Patent: Apr. 4, 1989

[54] BURN-IN BOARD LOADER AND UNLOADER

[75] Inventors: Larry J. Lape, Sugarland; Ramon A. Salazar, Houston, both of Tex.

[73] Assignee: Reliability Incorporated, Houston, Tex.

[21] Appl. No.: 44,873

[22] Filed: Apr. 30, 1987

[51] Int. Cl.⁴ .................................. H05K 3/30
[52] U.S. Cl. ............................. 29/741; 29/743; 29/759; 324/158 F
[58] Field of Search ............... 29/741, 740, 759, 760, 29/743; 324/158 F

[56] References Cited

U.S. PATENT DOCUMENTS

| 3,453,714 | 7/1969 | Clark et al. | 29/203 |
| 3,623,637 | 11/1971 | Miller | 221/211 |
| 3,736,651 | 6/1973 | Law et al. | 29/428 |
| 4,079,489 | 3/1978 | Kowalski et al. | 29/33 |
| 4,149,311 | 4/1979 | Benson | 29/741 |
| 4,292,116 | 9/1981 | Takahaski et al. | 156/566 |
| 4,304,514 | 12/1981 | Pfaff | 414/224 |
| 4,375,126 | 3/1983 | Düll et al. | 29/740 |
| 4,381,601 | 5/1983 | Tamai et al. | 29/740 |
| 4,393,579 | 7/1983 | Van Hooreweder | 29/740 |
| 4,437,232 | 3/1984 | Araki et al. | 29/740 |
| 4,439,917 | 4/1984 | Pearson | 29/825 |
| 4,459,743 | 7/1984 | Watanabe et al. | 29/740 |
| 4,476,626 | 10/1984 | Gumbert et al. | 29/740 |
| 4,480,780 | 11/1984 | Claeskens et al. | 228/180 |
| 4,515,507 | 5/1985 | Asai et al. | 414/226 |
| 4,527,327 | 7/1985 | Van Deuren | 29/740 |
| 4,567,652 | 2/1986 | Gussman et al. | 29/837 |
| 4,584,764 | 4/1986 | Gussman | 29/705 |
| 4,586,252 | 5/1986 | Faticanti | 29/762 |
| 4,588,092 | 5/1986 | Moechnig et al. | 324/158 F |
| 4,610,473 | 9/1986 | Hawkswell | 294/64.1 |
| 4,670,979 | 6/1987 | Yoshino et al. | 29/741 |

FOREIGN PATENT DOCUMENTS 199965 12/1982 Japan .................. 324/158 F

OTHER PUBLICATIONS

Idea, Inc. New Product Release for PLCC/LCC Loader/Unloader for Burn-In Boards.

Primary Examiner—Carl E. Hall
Attorney, Agent, or Firm—Gregory L. Maag; David S. Wise

[57] ABSTRACT

An apparatus for inserting IC packages into sockets on a burn-in board and for extracting IC packages therefrom includes a plurality of loader/unloader mechanisms affixed to a rotatable platform, the platform being adapted to support one or more burn-in boards and to position sockets mounted on the burn-in boards beneath the loader/unloader mechanisms one row at a time. The loader/unloader mechanisms include a vacuum means for lifting IC packages and pneumatic cylinders for transporting the packages to and from the burn-in boards. IC packages are gravity fed along a delivery channel both to and from the loader/unloader mechanisms by rotation of the platform.

21 Claims, 6 Drawing Sheets

BURN-IN BOARD LOADER AND UNLOADER

BACKGROUND OF THE INVENTION

The present invention relates generally to the field of automated apparatus for handling electronic circuit components and, more particularly, to automated apparatus for use in the art of burning-in circuit components prior to their distribution and use. Still more particularly, the present invention is directed to the art of automated insertion and removal of electronic integrated circuit (IC) packages into and out of sockets on printed circuit (PC) boards, and to the art of testing burn-in boards.

According to present practices, IC packages are mass-produced and installed in electronic circuits within highly sophisticated, complex, and costly equipment. As with many mass-produced products, IC packages are prone to failure, in some cases within the first one thousand hours of operation. The complexity of equipment within which such packages are installed makes post-installation failures highly undesirable. For example, when equipment reaches the final inspection stage of production, before failures are detected, the high level skills required for inspection and repair add a significant cost to production expenses. Even more significantly, when the product has been installed in the field and a service technician must make warranty repairs, the costs thereby incurred can have a significant effect on profitability. More and more often, however, post-installation failures simply cannot be tolerated because the potentially disastrous consequences. As a result, manufacturers of electronic equipment are demanding ever greater quality and dependability in commercial grade IC packages.

Quality and dependability are enhanced substantially by early detection of those IC packages likely to fail in the first few hours of operation, prior to the installation of packages in electronic equipment. One of the methods for detecting flawed IC packages is referred to generally as "burn-in". According to burn-in techniques, IC packages are stressed within their physical and electrical limits prior to installation, whereby those packages likely to become early failures in completed equipment can be discovered.

Burn-in involves placing a large number of IC packages on one or more PC boards ("burn-in boards"); placing the burn-in boards with the packages mounted thereon in a chamber whose environment, particularly temperature, is controllable; applying direct current (dc) biases to each package on each board in such a manner as to forward and reverse bias as many of the package's junctions as possible, and/or actively clocking each package to its maximum rated conditions, such application of dc biases, clock signals, and loads being accomplished substantially simultaneously to each package; removing the component boards from the chamber after the IC packages have been subjected to the environmental condition of the chamber and the biases, clock signals, and loads for a designated period of time; and removing the IC packages from the burn-in boards.

The IC packages can be electrically tested either within or outside the burn-in chamber, depending on the sophistication of the particular chamber, by applying a room temperature test of critical dc parameters, e.g., input currents and thresholds, output voltages and currents, and, in the case of digital components, by making a functional test to verify truth table performance. In this way, the packages that fail during burn-in are detected and segregated from those that do not fail.

Because the packages that do not fail during the burn-in process have withstood substantial stress, such IC packages possess a high degree of dependability and can be installed in highly complex equipment with reasonable confidence that such IC packages will not fail prematurely.

A second method for improving the quality control of IC packages (sometimes performed as a part of burn-in) is to verify that the IC packages function properly according to their minimum rated electrical operational specifications. Typically, after or during "burn-in", each IC package is tested across a broad range of parameters and, in some cases, graded as to its performance. Thereafter, the IC packages may be sorted into groups according to the performance grades.

The burn-in and test processes, however, although successful in reducing expenses associated with flawed IC packages, are not themselves without expense. Substantial capital expenditures are necessary to purchase or to construct burn-in chambers, burn-in boards, and test equipment. Personnel must be employed and trained to operate the equipment and to monitor the time-consuming processes. So substantial are the investments that independent businesses provide burn-in and test services to a variety of manufacturers. Cost effectiveness of the burn-in and test processes is therefore essential.

One means for improving the cost effectiveness of the burn-in and test processes is to reduce labor expenses and to improve efficiency and quality control through the use of automation. Accordingly, efforts have been made by the assignee of the present application and others to automate various aspects of the burn-in process. For example, assignee's U.S. Pat. No. 4,567,652, which is expressly incorporated herein by reference, discloses an apparatus for receiving IC packages from storage tubes and for loading the packages into sockets on a burn-in board for subsequent burn-in and test. In addition, assignee's U.S. Pat. No. 4,584,764, which also is expressly incorporated herein by reference, discloses an apparatus for unloading IC packages from burn-in boards subsequent to burn-in and test and, if desired, for sorting tested IC packages according to performance grades.

The advantages of automated loading and unloading of IC packages are well known. Automated handling enables the use of a computer to track and document the progress of each IC package through the burn-in process. In situations involving a high volume of IC packages for burn-in, automated handling equipment may be used to achieve a higher throughput of IC packages more efficiently than could be achieved otherwise. A single automated loader, for example, can easily replace eight or more very efficient employees assigned to the tedious task of loading burn-in boards. In any situation, automated handling equipment provides improved reliability and consistency of work product. Automated handling equipment, however, is generally very expensive.

Automated burn-in board loaders, unloaders, and testers, because of the distinctly different nature of their operation, generally are sold as independent units, any one of which may costs from $20,000 to $50,000 or more. The substantial nature of the capital investment required for purchase of this equipment, in spite of the known advantages of its use, represents an impediment to its purchase by even large manufacturers. Accordingly, there exists a need in the art for reasonably priced automated handling equipment. One means by which this end may be accomplished is to design an improved apparatus which, in spite of the distinctly different nature of loaders, unloaders, and testers, combines the three functions in a single, efficient machine.

SUMMARY OF THE INVENTION

Accordingly, there is provided an apparatus for loading integrated circuit (IC) packages into and unloading IC packages from sockets mounted on printed circuit boards, including rotatable support means for supporting one or more printed circuit boards in a substantially horizontal position and for rotating the boards in both the clockwise and counter-clockwise direction to various other inclined positions. The apparatus further includes a transport means affixed to the rotatable support means for inserting IC packages into and extracting IC packages from the sockets on the burn-in boards, and a delivery means for delivering the IC packages to and from the transport means.

The loader/unloader apparatus further includes a control system for receiving electrical signals from sensors and delivering electrical signals to apparatus so as to properly position the burn-in boards beneath the transport means and so as to insure smooth operation of the automated insertion and extraction process.

The rotatable support means may include a platform which is rotatable about its axis in both the clockwise and counterclockwise direction. A table may be movably affixed to the platform for supporting one or more burn-in boards and for moving the burn-in boards in the forward, rearward, and lateral directions so as to position rows of sockets beneath the transport means.

The transport means may include a vacuum actuated pick-up head for lifting IC packages and may have air cylinders affixed to produce vertical and horizontal motion of the pick-up head so as to alternately position the pick-up head over sockets on the burn-in board and over the delivery means. The delivery means includes a track along which the IC packages may slide, either towards the transport means when the platform is in the loading position, or away from the transport means and towards IC package storage tubes when the platform is in the unloading position. The delivery means may also include a gate mechanism for delivering the IC packages to and from the transport means one IC package at a time.

The loader/unloader apparatus may also include a tapered wedge member attached to the delivery channel used to partially unseat DIP's from their sockets so as to permit removal of the DIP from its socket by the vacuum actuated pick-up head.

Additionally, the invention may include socket testing means allowing functional tests to be performed on the sockets so as to insure their operativeness. Such testing means may include test-heads having a plurality of downwardly extending electrical leads for mating with the IC sockets to be tested, and electrical conductors attached to those leads providing communication means between the test-heads and the control system.

DESCRIPTION OF THE PREFERRED EMBODIMENT

"Burn-in" refers generally to the technique whereby integrated circuit (IC) packages are stressed, and sometimes tested, within their physical and electrical limits prior to their sale or distribution so that those packages likely to become early failures in complicated equipment can be discovered, and so that IC packages, in some cases, can be graded and sorted according to performance specifications. The burn-in technique generally includes loading the IC packages into sockets on burn-in boards, placing the burn-in boards in a chamber whose environment, particularly temperature, is controllable, applying electrical test signals to the boards while su jecting the IC packages to the maximum temperature ading therefore, removing the burn-in board from the c amber, and unloading the IC packages from the burn-in oards. In addition, it is sometimes desirable to sort the IC packages by performance grade after burn-in.

Figure 1:
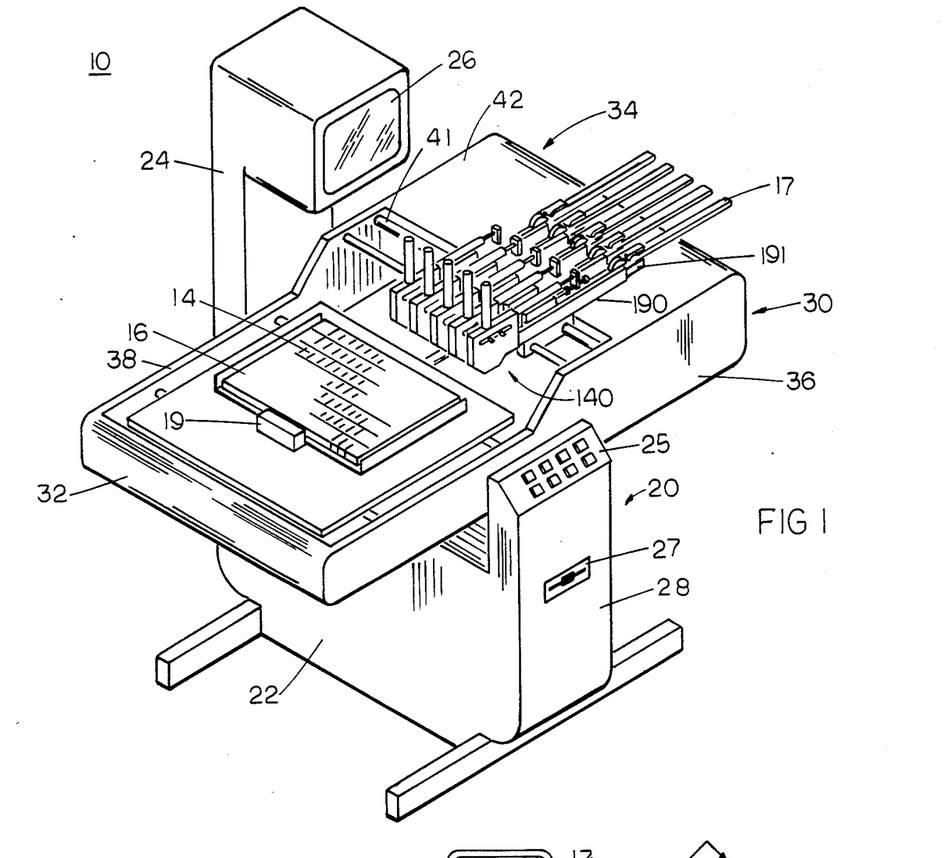
FIG. 1 shows a perspective view of the loader/unloader apparatus structured in accordance with the principles of the present invention.

Referring initially to FIG. 1, there is shown a loader/unloader apparatus 10 for automatically loading IC packages (not shown) into sockets 14 on one or more burn-in boards 16. Typical IC packages, as are referred to herein, are dual in-line package ("DIPs"), which comprise a parallelpiped body portion having from four to sixty-four electrical leads of a generally L-shaped cross-section extending out and down from the opposing sides of the body. The overall width of the IC package may be, for example, 0.3, 0.4, or 0.6 inch. The sockets 14 mounted on the burn-in boards 16 include socket contacts defining slots for receiving electrical leads on IC packages. Alternatively, the IC package may be a surface mounted device ("chip") including small outline integrated circuits (SOIC's), plastic leaded chip carriers (PLCC's), ceramic leaded chip carriers (CLCC's), or leadless chip carriers (LCC's). The SOIC also comprises a generally parallelpiped body portion having electrical leads extending from opposing sides of the body. The electrical leads may have either a J-shaped or an S-shaped ("gull wing") cross-section permitting the lead to lie on the surface of the socket 14 rather than being inserted into slots in the socket The PLCC, CLCC, and LCC have bodies which are of a square or rectangular geometry with a relatively thin cross-section, giving these IC packages an overall wafer-shaped appearance. In the usual construction, the PLCC and the CLCC have multiple electrical leads positioned flush with or bent into close proximity with the body of the package while the LCC has conductive coatings applied at select areas on the major body surfaces. To accommodate surface mounted IC packages, the sockets 14 therefore include socket contacts having conductive coatings on the surface of the socket.

The loader/unloader 10 shown in FIG. 1 may be used to load all types of IC packages on and unload them from burn-in boards. Additionally, the apparatus may be used to selectively unload, and thereby sort, chips after the burn-in process has been completed.

Referring still to FIG. 1, loader/unloader apparatus 10 is shown in a commercial package and is comprised generally of support structure 20 and rotatable platform 30. Support structure 20 includes a base portion 22 for supporting platform 30 and a stanchion portion 24. The support structure 20 comprises a frame (not shown) manufactured from structural tubing or other heavy gauge metal which is covered with sheet metal panels, such as panel 28. Base portion 22 and stanchion portion 24 also enclose certain drive mechanisms and control apparatus hereafter described in greater detail.

THE PLATFORM

Figure 2:
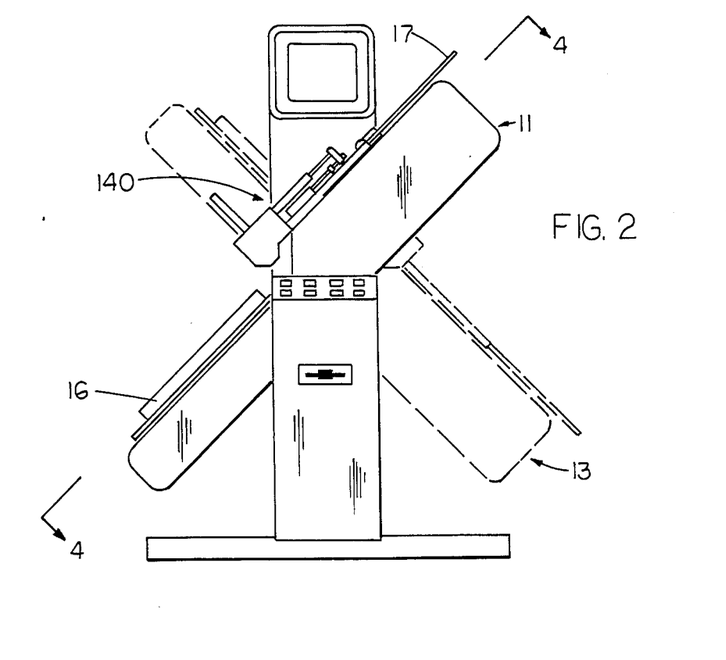
FIG. 2 shows a front view of the loader/unloader apparatus depicted in FIG. 1.
Figure 4:
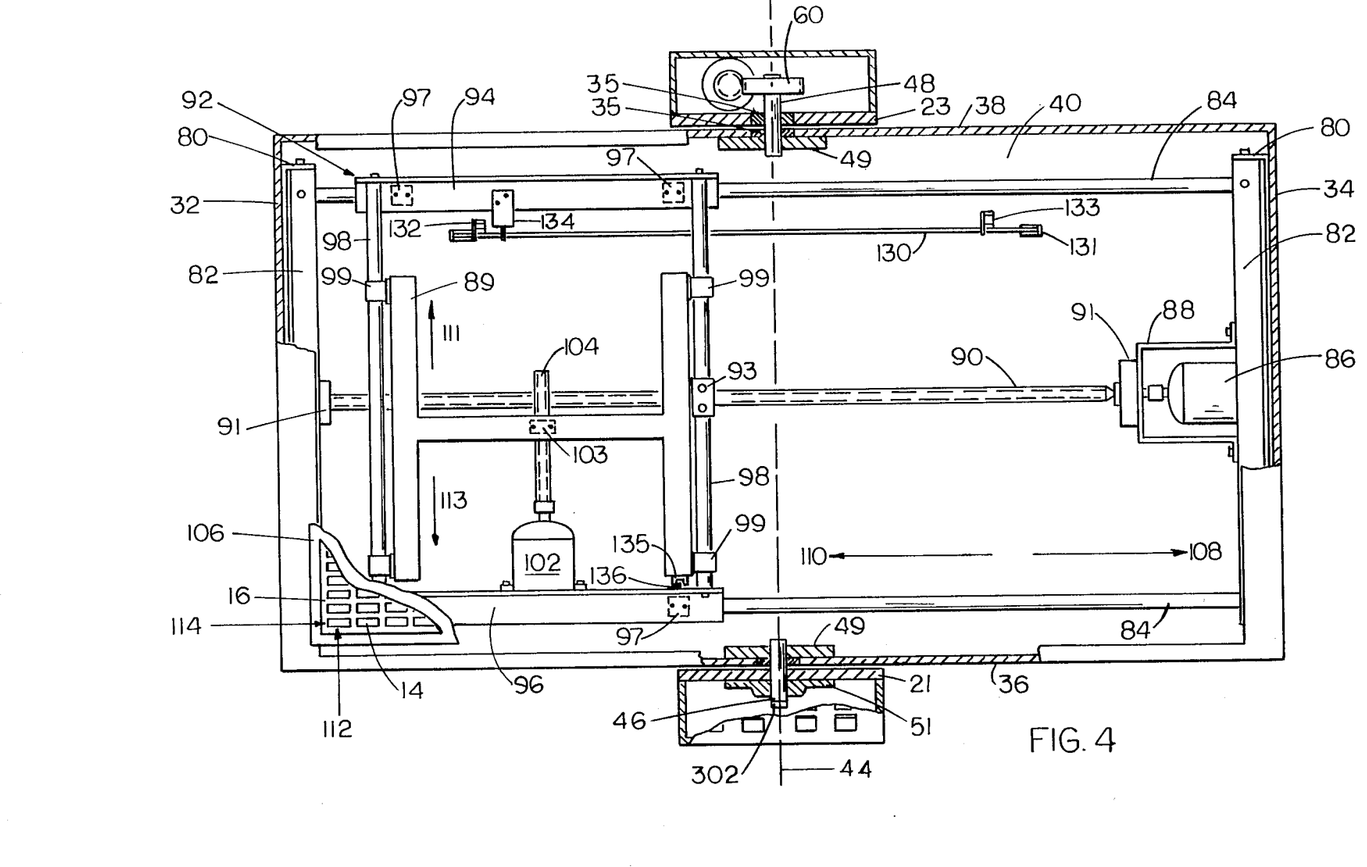
FIG. 4 shows a cross-section of the loader/unloader apparatus taken along line 4—4 of FIG. 2 with portions thereof being removed or cut away so as to disclose pertinent portions of the apparatus.

Referring briefly to FIGS. 2 and 4, platform 30 is generally comprised of left and right end panels 32 and 34 respectively, front panel 36, rear panel 38, and bottom panel 40, these panels being bolted, welded or otherwise suitably fastened together at substantially right angles so as to form a box-like structure. Referring to FIG. 1, canopy 42 is rigidly attached to right end panel 34, front panel 36 and rear panel 38 and extends approximately one-third the length of platform 30, thereby extending above a portion of bottom panel 40 and forming a partial enclosure into which burn-in boards 16 may be positioned as described in greater detail below. Lateral cross bars 41 span the width of platform 30 and are spaced above burn-in board 16 where they are rigidly affixed to front and rear panels 36 and 38 so as to provide slidable support for a plurality of loader/unloader mechanisms 140, also hereafter described in greater detail.

As can be seen most clearly in FIG. 4, platform 30 is rotatable about an axis 44 which extends generally perpendicular to front panel 36 and rear panel 38. Platform 30 rotates about axis 44 on front shaft 46 and rear shaft 48. Shafts 46 and 48 are coaxially aligned and keyed to support plates 49 which are then bolted to front panel 36 and rear panel 38. Front shaft 46 is received through apertures in front panel 36 and in framing member 21 of base 22 and is supported by a flange-type bearing 51 which is bolted to framing member 21. Rear shaft 48 is received through bushings 35, positioned in apertures in rear panel 38 and framing member 23 of base 22, and is rigidly attached to drive sprocket 60.

Referring again to FIG. 2, loader/unloader apparatus 10 is shown in loading position 11, i.e., the position in which loader/unloader mechanism 140 loads IC packages delivered from IC package storage tubes 17 into sockets mounted on burn-in-board 16. FIG. 2 also illustrates loader/unloader apparatus 10 in unloading position 13 (dashed line) in which loader/unloader mechanism 140 extracts IC packages from sockets on burn-in board 16 and transports the packages to storage tubes 17.

Figure 3:
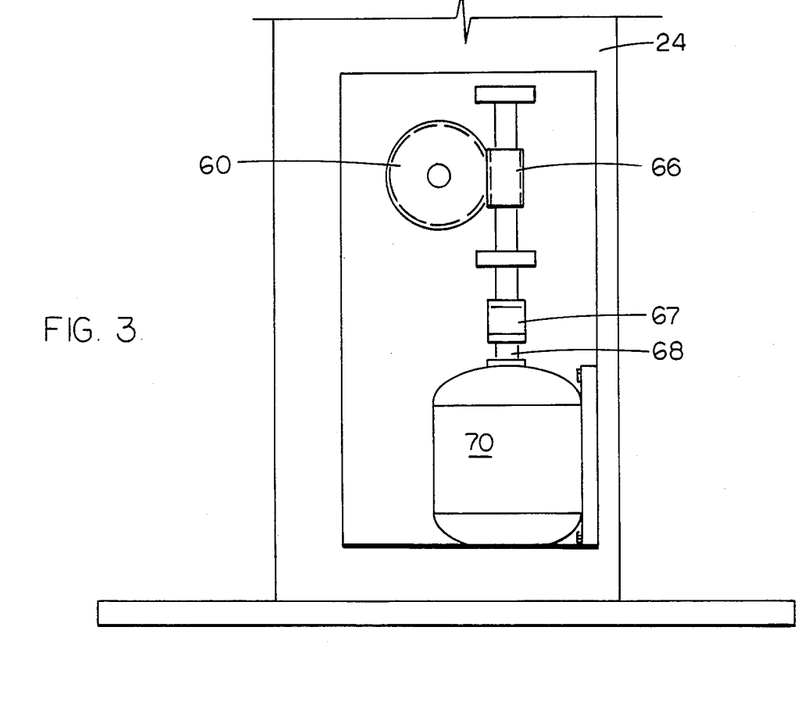
FIG. 3 shows a partial rear view of the loader/unloader apparatus of FIG. 1 with portions thereof removed so as to disclose pertinent internal apparatus.

Referring now to FIG. 3, there is shown a partial rear view of the lower portion of stanchion 24 of support structure 20 with a rear panel 28 removed, thereby revealing the drive apparatus used to rotate platform 30. As shown, drive motor 70 is affixed within stanchion 24 in a vertical orientation. Motor shaft 68 is connected through coupling 67 to worm-gear 66 which engages the teeth of drive sprocket 60. Drive motor 70, such as Model No. M092 manufactured by the Superior Electric Company is reversible. Upon receipt of the appropriate signal from a controller (not shown), such as a microprocessor hereafter described in greater detail, drive motor 70 will turn worm-gear 66 and rotate drive sprocket 60 in a clockwise direction as viewed in FIG. 3 so as to rotate platform 30 into the loading position 11 depicted in FIG. 2. A potentiometer 302, mounted on front shaft 46 within support structure 20, shown in FIG. 4, sends a continuous analog voltage signal to the controller, thereby indicating the angular position of platform 30. On achieving the desired degree of rotation, which may be, for example, 35 degrees from the horizontal for loading certain sized chips and DIPs, the controller will stop drive motor 70 and halt the rotation of platform 30. Upon receipt of another control signal from the controller, such as when loading has been completed, motor drive 70 and worm gear 66 will rotate drive sprocket 60 in the counter-clockwise direction as viewed in FIG. 3, and thereby rotate platform 30 back to the horizontal position shown in FIG. 1 or to the unloading position 13 as depicted in FIG. 2. Potentiometer 302 is again employed to continuously signal the angular position of platform 30.

THE TABLE

Referring again to FIG. 4, a section view of platform 30, burn-in board 16 is mounted on table 106, with portions of each cut-away to depict table carriage 92 and table shuttle 89; table 106, table carriage 92 and table shuttle 89 all cooperatively interact to maneuver burn-in board 16 and sockets 14 beneath the loader/unloader mechanisms 140, depicted in FIG. 1, as hereafter described. As shown in FIG. 4, affixed to end panels 32 and 34 of platform 30 are brackets 80 which rigidly support cross members 82 above bottom panel 40. Cylindrical carriage support rods 84 are bolted to cross members 82, thereby forming a track on which table carriage 92, described below, may traverse in either the forward or rearward direction, arrows 108 and 110 depicted in FIG. 4 defining the forward and rearward directions respectively. The forward and rearward movement of table carriage 92 is controlled by carriage drive motor 86 which is secured to cross member 82 nearest to right end panel 34. The shaft of carriage drive motor 86 is connected to a threaded cylindrical metallic rod or screw 90 which is supported at both ends thereof by screw journal boxes 91, the left most screw journal box 91 being bolted to left cross member 82 and right screw journal box 91 being secured to motor mounting bracket 88, which, in turn, is bolted to right cross member 82.

Table carriage 92, slidably supported on carriage support rods 84, includes rear runner 94, front runner 96, carriage support housings 97 and shuttle support rods 98. Rear runner 94 and front runner 96 are generally L-shaped in cross section and include a vertical portion and a bottom flat portion to which a pair of carriage support housings 97 are attached. The carriage support housings 97 are slidably affixed to carriage support rods 84, carriage support rods 84 passing through bushings contained therein, such as Thompson recirculating ball bushings. Shuttle support rods 98 extend between, and are rigidly attached to, the vertical portions of runners 94 and 96, thereby forming a track on which table shuttle 89 may traverse laterally in the direction denoted by arrows 111 and 113 in FIG. 4, table shuttle 89 providing support for and being affixed to table 106 by suitable fastening means such as bolts (not shown). Shuttle support rods 98 are slidably received through bushings in four shuttle support housings 99 which are fastened to the sides of shuttle 89, such bushings also typically being Thompson recirculating ball bushings. Lateral movement of shuttle 89 and table 106 in directions 111 or 113 is initiated by shuttle drive motor 102 which is secured to front runner 96. The shaft of shuttle drive motor 102 is connected to a second threaded cylindrical metallic rod or screw 104 which passes through a threaded coupling 103 attached to underside of table shuttle 89.

In operation, table 106 and burn-in board 16 are advanced in either the forward direction 108 or rearward direction 110 by means of the rotation of screw 90. Rotational motion of the screw 90, generated by energizing carriage drive motor 86, is translated to forward and rearward linear motion of table 106 by means of threaded coupling 93 affixed to forward shuttle support rod 98. Threads of coupling 93 cooperatively engage the thread-like groves extending continuously about the circumference of screw 90, causing table carriage 92 to advance linearly as screw 90 rotates. Similarly, table 106 and burn-in board 16 are advanced in a lateral direction 111 or 113 by means of the rotation of screw 104. Screw 104 passes through threaded coupling 103 which is secured to table shuttle 89. Rotational motion of screw 104, generated by energizing shuttle drive motor 102, is translated into linear motion of table 106 by means of threaded coupling 103 whose threads cooperatively engage the groves of screw 104, causing the table 106 to advance laterally in a direction perpendicular to the forward and rearward directions depicted by arrows 108 and 110 respectively.

Burn-in board 16 is removably affixed in a predetermined position to table 106 by suitable clamping means such as pneumatic actuated clamp 19 shown in FIG. 1. IC sockets 14 are arranged on the burn-in board 16 in a substantially close fitting array comprised of rows which are aligned as indicated by the arrow at 112, and in columns which are aligned as indicated by the arrow at 114. As is evident from FIG. 4, IC sockets 14 aligned in a row are arranged side by side; IC sockets 14 aligned in a column are arranged end to end. The slidable nature of the attachment of the loader/unloader mechanisms 140 onto cross bars 41, shown best in FIG. 1, facilitate adjustment of the lateral position of the loader/unloader mechanisms 140 so as to accommodate a variety of sizes of burn-in boards having differing spacing between columns of sockets.

TABLE POSITION SENSORS

Referring now to FIGS. 1 and 4, loader/unloader apparatus 10 includes a control system, hereinafter described in greater detail, which among other functions serves to direct the proper positioning of table 106 and burn-in board 16 with respect to loader/unloader mechanisms 140 so as to align a column of sockets 14 on burn-in board 16 with each loader/unloader mechanism 140. As described above, positioning of table 106 and burn-in board 16 is accomplished by controlling the operation of carriage drive motor 86 and shuttle drive motor 102. These motors are precisely controllable stepper motors whose direction of rotation is reversable and whose degree of rotation is accurately controlled according to step pulses generated by the controller. These drive motors 86 and 102 may be, for example, model numbers M063 as manufactured by the Superior Electric Company.

The precise control achievable through the use of such motors translates into equally precise control of the position of table 106. Accordingly, the present invention does not require the use of a series of position sensors. Instead, the controller utilized in loader/unloader apparatus 10 only requires sensors to indicate when table carriage 92 and table shuttle 89 are in their starting or "home" positions. Upon receipt of signals indicating that table carriage 92 and table carriage 89 are in their respective home positions, the controller can drive carriage 92 and shuttle 89 to the proper starting position for loading or unloading IC packages on burn-in board 16, the exact positioning of which will depend upon a variety of factors, such as the number and size of burn-in boards and the size and type of IC packages to be handled.

The position sensors employed by the present invention are best shown in FIG. 4. As shown, support rod 130 is affixed to bottom panel 40 parallel to support rods 84 by brackets 131. Affixed to support rod 130 are photoelectric sensors 132 and 133, such as model no. CLI-355, manufactured by the Clairex Electronics Company, each having a channel formed in the upper surface thereof for detecting the presence of downwardly extending indicator 134 which is rigidly attached to rear runner 94 of table carriage 92. Indicator 134 and photoelectric sensors 132 and 133 are positioned such that indicator 134 may pass through the channel in their upper surfaces as table carriage 92 moves linearly in forward or rearward direction 108 and 110. Photoelectric sensor 132 signals the limit of travel in the rearward direction 110 and signals the home position in the forward and rearward directions for each loading or unloading sequence. While the movement and position of table carriage 92 is precisely controlled through the use of a stepper drive motor as described above, photoelectric sensor 133 serves as a back-up or safety device to limit forward travel of table carriage 92 should a control malfunction occur. Similarly, photoelectric sensor 135, which may also be model no. CLI-355, manufactured by the Clairex Electronics Company, is mounted on table shuttle 89 and positioned so as to receive indicator 136 which is attached to and extends from forward runner 96. Photoelectric sensor 135 signals the limit of travel of table shuttle 89 in the lateral direction 113 and signals the home position in the lateral direction for any loading or unloading sequence.

CONTROL SYSTEM

Figure 10:
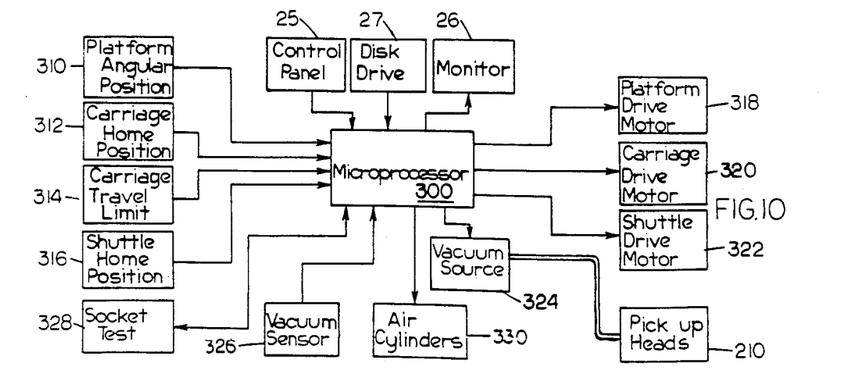
FIG. 10 shows a block diagram of a control system for the loader/unloader apparatus.

FIG. 10 shows a block diagram disclosing the basic organization of the control system for the loader/unloader apparatus 10. The control system is centered around a microprocessor 300, such as Model No. 2003XC manufactured by Texas Microsystems, Inc. The microprocessor 300 is housed in support structure 20.

The loader/unloader apparatus 10 includes a front control panel 25, shown also in FIG. 1, having a plurality of push buttons arranged thereon for an operator to enter set-up parameters and to command certain operations of the loader/unloader apparatus 10. The commands which may be communicated by an operator through control panel 25 to the microprocessor 300 include start, stop, run, and step commands. Certain tests of loader/unloader apparatus 10 may also be initiated from control panel 25. Floppy disk drive 27, supported in base structure 22, provides a means through which to input operating instructions and data to microprocessor 300. Input and output messages are communicated to the operator via monitor 26 which is supported by and housed in stanchion 24 as shown in FIG. 1.

In addition to the control panel 25, disk drive 27, and monitor 26, the control system comprises additional input and output subsystems. The first additional input subsystem 310 is for communicating the angular position of platform 30 and comprises potentiometer 302, shown in FIG. 4, which continuously transmits an analog voltage signal to microprocessor 300 indicating the angular position of platform 30. An output subsystem 318 is provided to start and stop platform drive motor 70 as required for the various IC package loading, unloading, and sorting functions to be performed by loader/unloader apparatus 10.

Input subsystems 312, 314, and 316 are also provided for receiving signals from photoelectric sensors 132, 133, and 135 respectively, located within platform 30 as shown in FIG. 4. As explained above, photoelectric sensors 132 and 135 define the starting or "home" position of table 106 within platform 30. In response to signals from photoelectric sensors 132 and 135, through output subsystems 320 and 322, microprocessor 300 operates carriage motor 86 and shuttle drive motor 102 to advance table 106 and burn-in board 16 in the forward, rearward, and lateral directions so as to position the proper row and column of sockets beneath the loader/unloader mechanisms 140. Input subsystem 314, including photoelectric sensor 133 is provided to signal microproccessor 300 should the carriage drive control system malfunction, allowing table carriage 92, shown in FIG. 4, to advance too far in the forward direction 108.

The control system for loader/unloader apparatus 10 also includes a vacuum source subsystem 324 which includes hardware by which microprocessor 300 controls actuation of pick-up heads 210 of loader/unloader mechanisms 140 as hereafter described in greater detail. A vacuum subsystem sensor 326 is provided to monitor the vacuum generated and available at the pick-up heads of loader/unloader mechanisms 140 so as to provide an input signal to microprocessor 300 indicating whether a particular loader/unloader mechanism 140 has successfully lifted an IC package by means of the vacuum generated and supplied to that loader/unloader mechanism 140.

Also included in the control system for loader/unloader apparatus 10 is a pneumatic source subsystem 330 which includes hardware by which microprocessor 300 controls actuation of clamp 19 and actuation of air cylinders 214 and 216, a part of the loader/unloader mechanism 140, hereafter described in greater detail.

The control system finally includes a socket test subsystem 328. Socket test subsystem 328, including testheads 400 hereinafter described in greater detail, is used to transmit test signals to, and record the response from, sockets which are to be loaded with IC packages for burn-in. By testing sockets before loading, defective sockets can be identified and their location recorded by microprocessor 300. During the loading process ten, IC packages will not be inserted into the defective sockets.

LOADER/UNLOADER MECHANISM

Loader/unloader mechanism 140 is employed to load and unload all types of IC packages, namely both chips and DIP's. The loading sequence for both types of IC packages is identical although slight modifications to the loader/unloader mechanism 140 are made to accommodate the physical differences between chips and DIP's. The loading sequence for IC packages will be described with reference to FIGS. 5A, 5B, 6 and 7 which depict loading of chips The modifications to loader/unloader mechanism 140 required for loading DIP's will be noted. The unloading of chips is described with reference to FIGS. 8A and 8B. The modifications to loader/unloader mechanism 140 required to unload DIP's from sockets on a burn-in board are described with reference to FIGS. 9A, 9B and 9C.

Figure 5A:
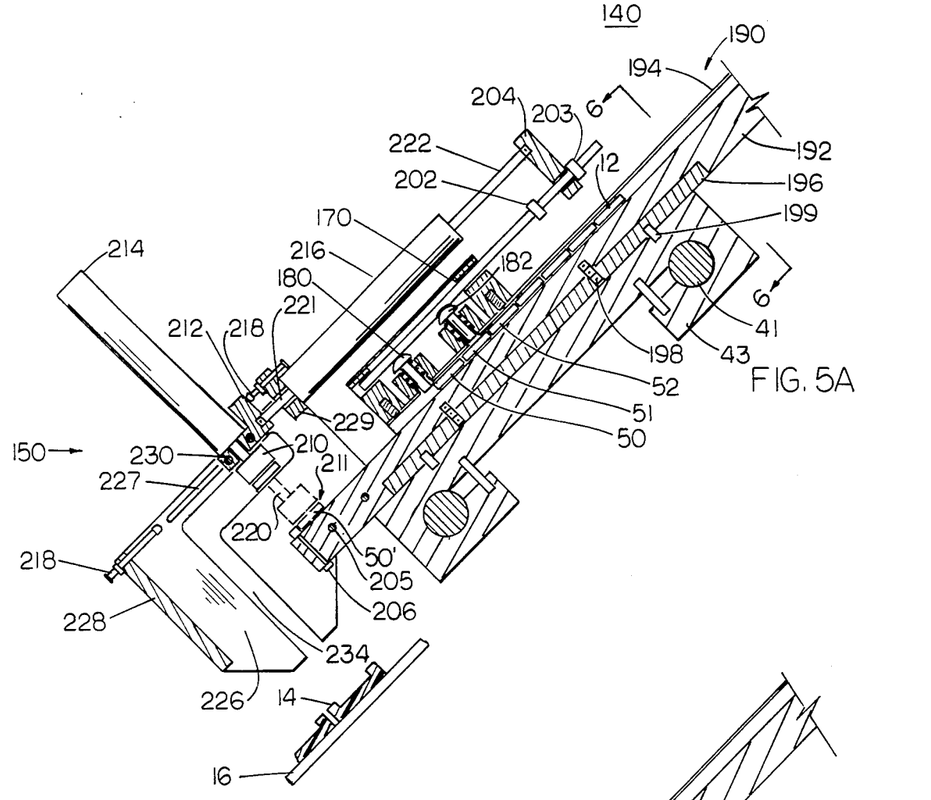
FIGS. 5A and 5B show a cross-section of a loader/unloader mechanism in the position for loading IC packages.

Referring now to FIG. 5A, one of a plurality of loader/unloader mechanisms 140 is shown in cross section while in the loading position. Loader/unloader mechanism 140 generally includes transport device 150, gate mechanism 170, and delivery channel 190. Due to the force of gravity, when platform 30 is in the loading position, delivery channel 190 provides a steady supply of IC packages 12 in serial fashion to the transport device 150 for insertion into sockets 14 on burn-in board 16. Gate mechanism 170 ensures that the IC packages 12 advance to transport device 150 one IC package at a time.

Figures 5B, 6:
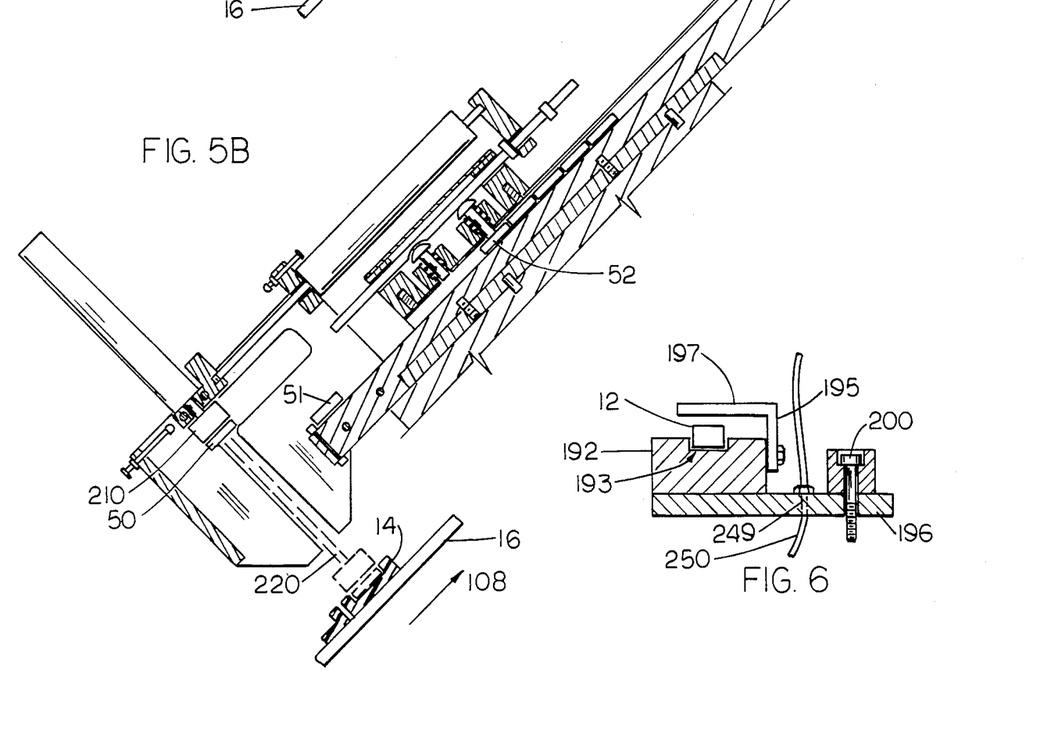
FIG. 6 shows a cross-section of the IC package delivery channel taken along line 6—6 in FIG. 5A.

Delivery channel 190 includes track 192, track cover 194 and track base 196. Referring now to FIGS. 5A and 6, track 192 includes a channel 193 in which IC packages 12 may slide. The width of channel 193 is dependent upon the width of the IC package then being loaded, the width of channel 193 being only slightly wider than IC package 12, so as to insure the proper orientation and position of the IC package. Transport device 150 picks up IC package 12 from delivery track 192 and loads it on burn-in board 16.

Track 192 is configured differently when loader/unloader mechanism 140 loads DIPs rather than chips on a burn-in board. Instead of having a channel 193 formed therein, track 192 instead is formed with a ridge, generally rectangular in cross section and having a width slightly less than the distance between the rows of leads extending from the DIP, allowing the DIP to straddle and slide upon the ridge.

Referring still to FIGS. 5A and 6, in either configuration, track 192 is attached to track base 196 by recessed screws 198. Track base 196 also includes pins 199 and a captured cap screw 200 for fastening track base 196 to support plate 43, which in turn is clamped to lateral cross bars 41. As cap screw 200 is the sole means for attaching delivery channel 190 and loader/unloader mechanism 140 to platform 30, loader/unloader mechanisms 140 can be quickly and easily changed when it is desirable to load or unload a different size or type of IC package than those previously handled. Track base 196 includes conduits 249 formed therein for connection to pneumatic hoses 250 which control the operation of transport mechanism 150, as explained below. Track cover 194, L-shaped in cross section, includes a side plate 195 and top plate 197 and is attached to track 192 by screws through side plate 195. Top plate 197 retains IC packages 12 in position in track 192 as the packages are fed toward gate mechanism 170 by the force of gravity.

Figure 7:
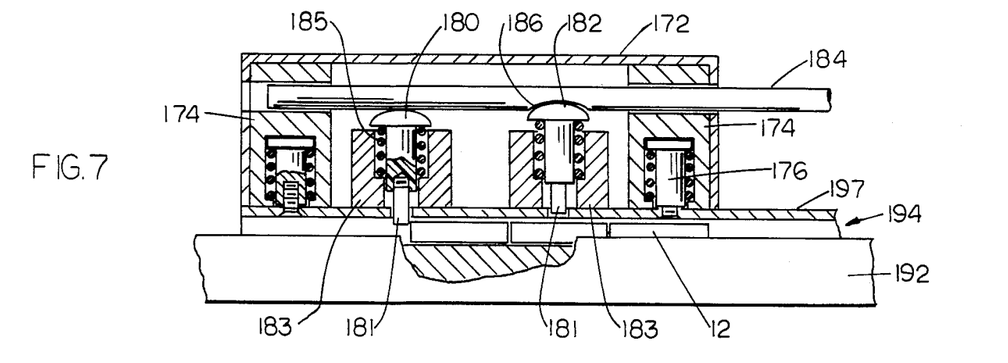
FIG. 7 shows an enlarged cross-section of the gate mechanism depicted in FIGS. 5A and 5B.

As shown in FIG. 5A, gate mechanism 170 is attached to top plate 197 of track cover 194. Gate mechanism 170, best shown in FIG. 7, includes enclosure 172, gate rod 184, left and right gate pins 180 and 182 respectively, bushing blocks 174 and support blocks 183. Referring to FIG. 7, enclosure 172 is generally box-like in configuration and is fastened to track cover 194 through bushing blocks 174 by spring loaded fasteners 176. Bushing blocks 174 are secured to enclosure 172 by flush mounted fasteners (not shown). The male portion of spring loaded fasteners 176 are recessed within top plate 197 of track cover 194 so as not to impede the flow of IC packages 12 along track 192. Gate rod 184 passes through enclosure 172 and is slidably received within coaxially aligned apertures in bushing blocks 174 allowing reciprocal motion of gate rod 184 therethrough. Left and right gate pins 180 and 182 are retained in position within enclosure 172 by support blocks 183 which are secured to enclosure 172 by flush mounted screws on other suitable fasteners (not shown), the gate pins 180 and 182 being separated by a distance greater than the length of the IC package being handled, that distance typically approximating one and one-half times the length of the IC package.

Gate pins 180 and 182 are internally threaded and fitted with a short length of rubber tubing 181 which is retained within the threaded portion of gate pins 180 and 182 through compression fit. An indentation 186 is formed on gate rod 184 so that as rod 184 reciprocates within enclosure 172, indentation 186 moves between positions above left gate pin 180 and above right gate pin 182. As indentation 186 moves above either gate pin 180 or 182, spring 185 forces the respective gate pin upward where it is captured by indentation 186. As gate rod 184 reciprocates further and indentation 186 moves correspondingly, indentation 186 cams the captured gate pin 180 or 182 downwardly such that the end of the tubing 181 protrudes through holes or slots formed in top plate 197 of track cover 194. With only one indentation 186 formed on gate rod 184, tubing 181 of one or both of gate pins 180 and 182 will extend through top plate 197 of track cover of 194 at all times. The length of gate pins 180 and 182 and of tubing 181 are of such dimensions so as to ensure that tubing 181 will impede the flow of IC packages along delivery channel 190 when gate pins 180 and 182 are not captured by indentation 186 of gate rod 184. Hereinafter, a reference to gate pins 180 and 182 shall refer to the entire gate pin assembly comprising both the screw portion and the length of tubing, it being understood that only tubing 181 actually extends into delivery channel 190.

Referring again to FIG. 5A, transport device 150 includes a vacuum actuated pickup head 210, slide block 212, vertical air cylinder 214, horizontal air cylinder 216, adjustable stops 218, front and rear face plates 224 and 226 respectively, and end plate 228 (front face plate shown in FIGS. 1 and 2). Front and rear face plates 224 and 226 are attached to delivery channel 190 by flush mounted bolts 205. Front and rear face plates 224 and 226 are also fastened to end plate 228 and spacer block 229 by suitable flush mounted fasteners (not shown). One end of horizontal cylinder 216 threadedly engages spacer block 229. Piston rod 221 extending from horizontal cylinder 216 is slidably received through an aperture formed in spacer block 229 and threadedly engages slide block 212. Slide block 212 is disposed between front plate 224 and rear plate 226. Guide pins 230 extend from slide block 212 at substantially right angles to the parallel planes formed by front face plate 224 and rear face plate 226, guide pins 230 being received within slots 227 formed in face plates 224 and 226, thereby supporting slide block 212 as piston rod 221 reciprocates within horizontal cylinder 216. Vertical cylinder 214 is threadedly engaged to the top of slide block 212. Piston rod 220 extending from vertical cylinder 214 is slidably received through an aperture formed in slide block 212 and threadedly engages vacuum actuated pick-up head 210.

Pick-up head 210, a metallic block, includes an internal conduit (not shown) one end of which terminates at the lower surface 211 of pick-up head 210, surface 211 forming the surface against which IC packages are secured during transport by a vacuum source which is connected to the other end of the internal conduit by a vacuum line or hose (not shown). The vacuum line passes through opening 234 formed in rear plate 226, opening 234 permitting the horizontal and vertical movement the vacuum line as piston rods 220 and 221 reciprocate so as to position pick-up head 210. As depicted in FIG. 5A, horizontal cylinder 216 includes piston rod 222 extending from the rearward end of cylinder 216, piston rod 222 threadedly engaging one end of connection bar 204. The opposite end of connection bar 204 is slotted so as to receive gate rod 184 and permit reciprocation therethrough. In this configuration, as piston rod 222 reciprocates within horizontal cylinder 216, connection bar 204 slides along gate rod 184 unimpeded until engaging collars 202 or 203 which are fastened to gate rod 184 by set screws or other suitable means (not shown). As piston rod 222 continues to travel after connection bar 204 has engaged either collar 202 or 203, gate rod 184 actuates gate mechanism 170 as hereinafter explained in more detail.

LOADING SEQUENCE

Before initiating the loading sequence of loader/unloader 10, an operator inserts the open end of an IC package storage tube 17 to each delivery channel 190 by clamping device 191 as depicted in FIG. 1. The operator additionally places a burn-in board 16 to table 106. The operator then depresses the "run" pushbutton on console 25 which first actuates pneumatic clamp 19, securing the burn-in board to table 106, and next rotates platform 30 into the loading position 11 as depicted in FIG. 2, with platform 30 sloping from right to left at an incline, for example, of approximately 35 degrees. Depending upon the size and mass of the particular IC packages being loaded, the loading angle may be lesser or greater than 35 degrees. The angle of incline must be steep enough to ensure the packages will properly feed through delivery channel 190, but not be so steep that the packages could be damaged as they slide from storage tubes 17 until the frontmost IC package 50 comes to rest within gate mechanism 170 as depicted in FIG. 5A.

Referring now to FIG. 5A, as platform 30 rotates from a substantially horizontal position shown in FIG. 1, to the loading position 11 as shown in FIG. 2, the IC packages 12 maintained in the storage tubes 17 slide into track 192 of delivery channel 190 due entirely to the force of gravity. Vertical cylinder 214 is initially positioned as shown in FIG. 5A with piston rod 220 completely retracted such that pick-up head 210 is in its uppermost position. Because of the interconnection between vertical piston 214, slide block 212, and piston rod 221, with vertical cylinder 214 in its initial position, piston rod 222 of horizontal cylinder 216 is fully extended, which when achieving that position caused connection bar 204 to contact and push against collar 203, thereby positioning indentation 186 of gate rod 184 above right gate pin 182. Against the action of springs 185, right gate pin 182 is captured by the indentation 186 of gate rod 184 so as not to extend into delivery channel 190. By contrast, left gate pin 180 is pressed downward by gate rod 184 so as to extend through the hole in track cover 194 and impede the flow of IC packages along delivery track 192. Thus, as platform 30 is rotated into the loading position, IC packages 12 continue to slide towards transport device 150 until the frontmost IC package 50 engages left gate pin 180.

Before controller 300 initiates the loading of IC packages 12 by transport mechanism 150, burn-in board 16 must be properly positioned within platform 30. Accordingly, as best shown in FIG. 4, controller 300 initiates travel of table carriage 92 in the rearward direction 110. As left runner 94 of table carriage 92 moves in the rearward direction 110, downwardly extending indicator 134 passes within the channel formed in the upper surface of photoelectric sensor 132 which then signals controller 300 that table carriage 92 is in the home or start position. Sequentially or simultaneously, controller 300 signals lateral drive motor 102 to drive table shuttle 89 in the lateral direction 113 until indicator 136 triggers photoelectric sensor 135 signaling controller 300 that shuttle 89 is in its home position. Having already received input signals via the floppy disk placed in disk drive 27 or from the operator's control panel 25 instructing controller 300 as to the size and number of burn-in boards 16, the size of the IC packages 12, and the spacing of sockets 14 on burn-in boards 16 positioned on table 106 and other such variables, controller 300 will activate drive motors 86 and 102 so as to position the first row of sockets 14 on burn-in board 16 directly below pickup heads 210 of loader/unloader mechanisms 140. It should be understood that the positioning of table 106 and burn-in board 16 may be accomplished before, during, or after platform 30 has been rotated into the loading position 11.

Except in the instance when a malfunction has been detected, loader/unloader mechanisms 140 will all operate in unison, thereby loading a number of sockets in a row simultaneously. Accordingly, the loading operation is understood by referring to and depicting a single loader/unloader mechanism 140 as depicted in FIG. 5A.

Referring first to FIG. 5A, when the first IC socket 14 is positioned beneath pick-up head 210 of loader/unloader mechanism 140, controller 300 actuates horizontal cylinder 216 so as to extend piston rod 221, retract piston rod 222, and thereby move slide block 212 and vertical cylinder 214 to the position shown in FIG. 5B.

As piston rod 221 is being extended, connection bar 204 slides along gate rod 184 until engaging collar 202. Referring again to FIG. 5A, as piston rod 221 continues its stroke, connection bar 204 pushes against collar 202 which pushes gate rod 184 until indentation 186 is no longer located above right gate pin 182, gate rod 184 thereby forcing right gate pin 182 through the aperture in top plate 197 of track cover 194 and pinning the IC package 51 within delivery channel 190 and preventing it from sliding further along track 192. Gate rod 184 continues to be pushed into enclosure 172 until piston rod 221 completes its stroke, at which time indentation 186 is located directly above left gate pin 180, allowing left gate pin 182 to clear itself from top plate 197 of track cover 194, thereby permitting the frontmost IC package 50 to slide down track 192 until it contacts and comes to rest against stop post 206, shown as IC package 50' in dashed lines in FIG. 5A.

After a timed interval, a second control signal generated by controller 300 actuates horizontal cylinder 216 and causes slide block 212 and vertical cylinder 214 to return to their initial positions shown in FIG. 5A such that pick-up head 210 is now positioned directly above IC package 50' now positioned against stop post 206. As this occurs, piston rod 222 is extended, causing connection bar 204 to slide along gate rod 184 until it engages rear collar 203 and draws gate rod 184 out of enclosure 172, which in turn causes left gate pin 180 to be cammed downward forcing it through top plate 197 of track cover 194 and into delivery channel 190. As gate rod 18 continues its rearward motion, indentation 186 slides above right gate pin 182. Spring 185 forces gate pin 182 upward and out of delivery channel 190 and thus out of contact with IC package 51, allowing IC packages 51 and 52 and all serially positioned packages to slide downward along track 192 one package length such that IC package 51 engages and comes to rest in the position previously vacated by IC package 50' against now extended left guide pin 180, IC package 52 coming to rest beneath right gate pin 182 in the position just vacated by IC package 51. Again, after a timed interval, controller 300 actuates vertical cylinder 214 and extends piston rod 220 and pickup head 210 downward until pickup head 210 is in close proximity to the top of IC package 50'. Controller 300 then actuates the vacuum source attached to pick-up head 210 and secures the top of IC package 50' against the bottom of pickup head 210. After a vacuum sensor has confirmed that IC package 50' has been picked-up, vertical cylinder 214 is actuated so that piston rod 220 is retracted.

Referring now to FIG. 5B, after a predetermined interval, horizontal cylinder 216 is then actuated, sending slide block 212 and vertical cylinder 214 to its frontmost position, IC package 50' held securely by pick-up head 210. As this occurs, the indentation 186 in guide rod 184 once again moves to a position above left gate pin 180 which causes right gate pin 182 to be forced downward into delivery channel 190 and to press against and thereby secure IC package 52 beneath it in track 192. As indentation 186 move above left gate pin 180, the force supplied by spring 185 retracts left gate pin 180 from track cover 194, allowing IC package 51 to slide down delivery channel 190 until engaging post 206 as shown in FIG. 5B. Still referring to FIG. 5B, after a timed interval, vertical cylinder 214 is actuated and piston rod 220 and pickup head 210 then move to their lower-most positions (dashed lines) and IC package 50 is positioned in socket 14, at which time controller 300 deactivates the vacuum supply to pickup head 210 and retracts piston 220 and pick-up head 210 to their uppermost position as shown in FIG. 5B. Burn-in board 16 is then propelled in the forward direction 108 as previously described, until the second row of sockets are aligned beneath the pickup head 210.

In a like manner, burn-in board 16 is driven forward after sockets in each row have passed beneath pick-up head 210 until sockets in the final row of burn-in board or boards 16 have been loaded. At this time, a number of columns of sockets have been loaded, that number dependent upon and equal to the number of loader/unloader mechanisms 140 affixed to platform 30. At this time, table shuttle 89 is propelled in the lateral direction 113 as shown in FIG. 4 so as to align columns of empty sockets with loader/unloader mechanisms 140. The empty sockets 14 which are now positioned beneath pick-up heads 210 are loaded as described above. Burn-in board 16 is then propelled in a rearward direction 110 in a step-wise fashion so as to complete the loading of the columns of sockets now aligned wit loader/unloader mechanisms 140. After loading IC packages into the last sockets in those columns, table shuttle 89 once again propels burn-in board 16 laterally in direction 113 so as to align additional columns of empty sockets with loader/unloader mechanisms 140. Thus, in this serpentine manner, all of the sockets on one or more burn-in boards 16 may be loaded.

On each occasion in which pick-up head 210 is employed to lift an IC package for transport, a vacuum sensor 326 depicted in the control diagram of FIG. 10, monitors the vacuum present at pick-up head 210 to determine whether an IC package has been lifted for transport. When vacuum sensor 326 detects that pick-up head 210 has not been successful in lifting an IC package, microprocessor 300 directs the following remedial procedures. In operation, vertical piston 214 is actuated so as to raise pick-up head 210 before the vacuum sensor 326 makes its first check. If vacuum sensor 326 signals that an IC package has not been lifted, vertical piston 214 is again actuated so as to extend piston rod 220 and pick-up head 210 to their lowermost positions. After the standard timed interval, vacuum is again applied to pick-up head 210 and vertical piston 214 is then actuated so as to raise pick-up head 210. At this time, a second test is made by vacuum sensor 326. If it is again determined that the IC package has not been lifted, a second remedial procedure is followed whereby horizontal cylinder 216 is actuated so as to first transport vertical piston 214 and pick-up head 210 to their position shown in FIG. 5B. Horizontal cylinder 216 is then actuated so as to return pick-up head 210 and vertical cylinder 214 to the position shown in FIG. 5A, this two-step process actuating gate mechanism 170 so as to deliver another IC package 12 against stop post 206. Pick-up head 210 is then driven downward toward IC package 12, the vacuum is applied, and pick-up head 210 is once again raised. In this position, vacuum sensor 326 again checks to determine whether an IC package has been lifted. If vacuum sensor 326 again determines that no IC package has been lifted by pick-up head 210, an error message is transmitted to the operator via monitor 26, and loading then ceases. While these checks and remedial procedures are being conducted, the positioning of burn-in board 16 and table 106 is maintained, and, except for the loader/unloader mechanism 140 involved in the procedures described, the remainder of the loader/unloader mechanisms 140 remain idle.

UNLOADING SEQUENCE

In the unloading mode, the loader/unloader mechanism 140 operates in substantially the same manner as when it loads IC packages onto burn-in boards, the only significant difference being that in the unloading sequence, the transport mechanism 150 removes IC packages from sockets on one or more burn-in boards and returns them to delivery channel 190 which, due to the force of gravity, delivers the IC packages to IC package storage tubes 17 after they pass through gate mechanism 170. Because of the similarity between the loading and unloading sequence, a brief description of the unloading sequences for both chips or DIP's are sufficient to enable one skilled in the art to understand and appreciate the unloading operation as performed by the present invention.

Referring first to FIGS. 1 and 2, after an operator has secured the loaded burn-in boards 16 to table 106, platform 30 is rotated to the unloading position 13 as depicted in dashed lines in FIG. 2. Table carriage 92 and table shuttle 89 are then driven to their home positions by controller 300. Once the home positions are signaled, table 106 is then driven to the proper unloading position within platform 30, that position depending upon the number and size of burn-in boards, the size and type of IC packages to be unloaded and similar variables which have been input to controller 300 through operator's panel 25 or disk drive 27. It should be understood that, once again, positioning of table 106 may be accomplished either before, after, or during rotation of platform 30.

UNLOADING OF CHIPS

Figures 8A, 8B:
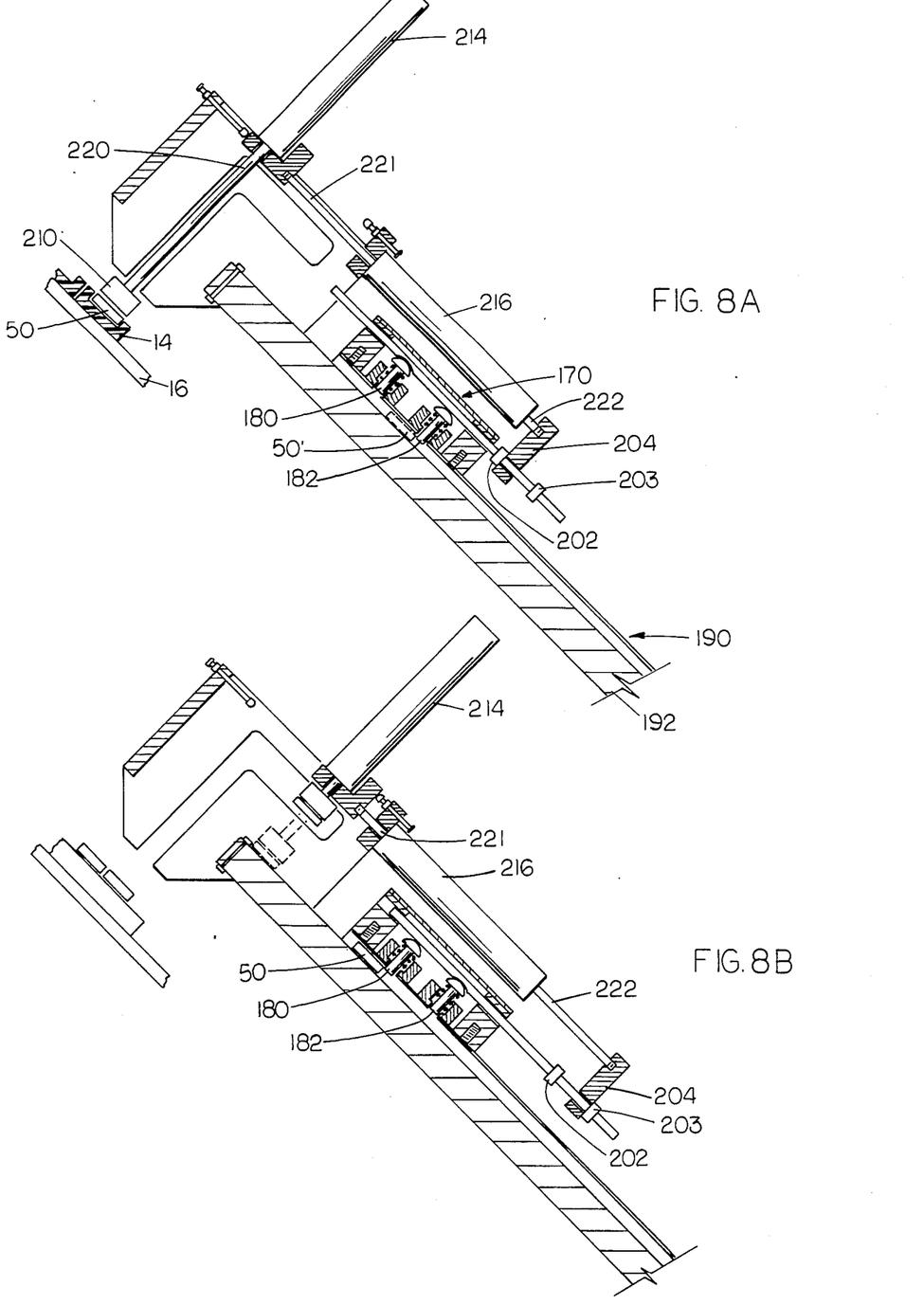
FIGS. 8A and 8B show a cross-section of a loader/unloader mechanism when in the position for unloading IC packages.

A brief description of the unloading sequence for chips will now be supplied. Referring now to FIG. 8A, once the first socket 14 having a chip 50 secured therein is positioned beneath pick-up head 210, controller 300 actuates vertical cylinder 214, thereby extending piston rod 220 and pick-up head 210 until piston head 210 is in close proximity to chip 50, at which time controller 300 initiates the vacuum to pick-up head 210 thereby lifting chip 50 from socket 14. Once a vacuum sensor (not shown) has determined that pick-up head 210 has successfully removed chip 50, vertical piston 214 is actuated so as to retract piston rod 220, thereby raising pick-up head 210 to its uppermost position. After a timed interval, horizontal cylinder 216 is actuated so as to retract piston rod 221 and extend rod 222 which, through the interaction of connection bar 204, collar 203, and gate mechanism 170, forces left gate pin 180 into delivery channel 190 as shown in FIG. 8B. Vertical cylinder 214 is then actuated so as to extend piston rod 220 and lower pick-up head 210 and chip 50 as shown in dashed lines in FIG. 8B. When chip 50 is on delivery track 192, the vacuum to pick-up head 210 is discontinued. Pick-up head 210 is then raised, thereby releasing IC package 50' and allowing it to slide along track 192 until it engages and comes to rest against left gate pin 180. After a timed interval, vertical cylinder 214 is again actuated so as to retract piston rod 220 and lift pick-up head 210. When horizontal piston 216 is then actuated so as to extend piston rod 221 and transport pick-up head and vertical piston 214 back to their positions shown in FIG. 8A, right gate pin 182 is then extended into delivery channel 192, and left gate pin 180 clears itself from channel 192, thereby releasing chip 50 which slides down delivery channel 190 toward storage tube 17 until coming to rest against now extended right gate pin 182 as shown in dashed lines as IC package 50' in FIG. 8A. After the next IC package 51 has been removed from its socket by activation of vertical cylinder 214 as described above, horizontal cylinder 216 will once again be actuated thereby extending piston rod 222 and thereby actuating gate mechanism 170 such that right gate pin 182 is retracted allowing chip 50' to slide towards and into the IC package storage tube 17 (not shown) and such that left gate pin 180 is extended into delivery channel 192 so as to impede the progress of the next chip, once that chip has been released from pick-up head 210. In this manner, chips are removed from sockets on burn-in boards and delivered back into IC package storage tubes, one chip at a time.

Although the procedure described may be employed to remove all the chips from sockets on the burn-in board simply in the order in which the socket are positioned beneath loader/unloader mechanism 140, the procedure outlined above may also be used to selectively unload and thereby sort chips according to performance ratings or grades exhibited by the chips during the burn-in process. Frequently during burn-in, the chips' performance is monitored and compared against certain industrial standards established for such performance. The performance for each chip may also be recorded, for example on a floppy disk, such that the performance record may then be employed after burn-in to sort the chips according to their performance grades. This sorting process is frequently desirable so that chips having like performance grades may be packaged and sold to customers desiring the assurance that all the chips purchased meet the performance specification for a particular application.

The loader/unloader apparatus 10 of the present invention is adapted for this sorting process. In practice, performance data on each chip which has undergone burn-in is input into microprocessor 300 through disk drive 27 as shown in FIG. 1, along with information conveying each chip's location on the burn-in board 16. With such information, microprocessor 300 will selectively activate loader/unloader mechanisms 140 as the burn-in board is moved in its serpentine fashion beneath pick-up heads 210, thereby enabling chips having like performance grades to be sorted and packaged together in storage tubes 17 shown in FIG. 1.

UNLOADING OF DIPS

Figures 9A, 9B, 9C, 11:
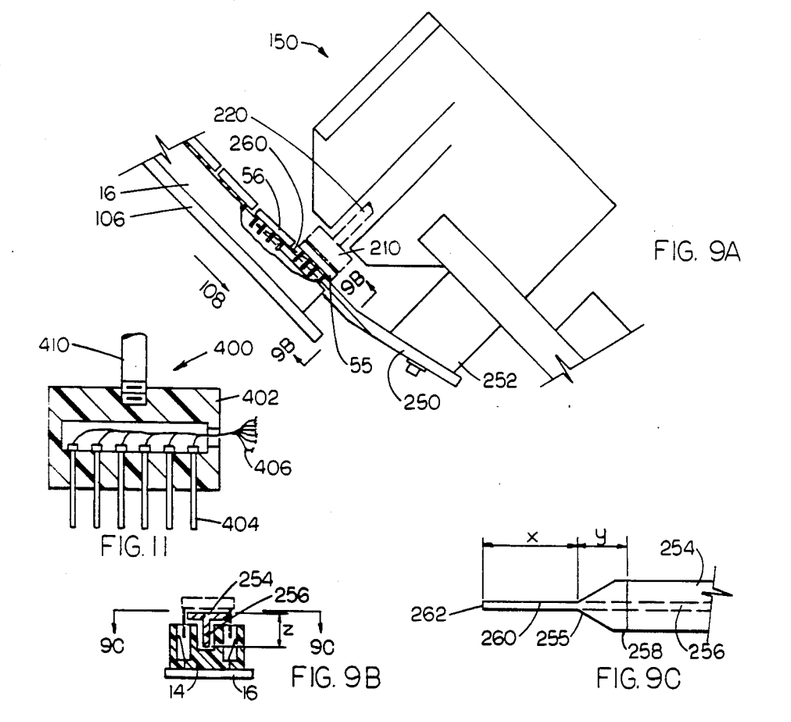
FIG. 9A shows a partial cross-section of a loader/unloader mechanism configured for removing DIP's from a burn-in board.
FIG. 9B shows a partial cross-section of the loader/unloader mechanism of FIG. 9A taken along line 9B—9B of FIG. 9A.
FIG. 9C shows a partial cross-section of a portion of the loader/unloader mechanism depicted in FIGS. 9A and 9B taken along line 9C—9C of FIG. 9B.
FIG. 11 shows a partial cross-section of a portion of the loader/unloader apparatus configured for testing sockets on a burn-in board.

The sequence for unloading DIP'S is identical to that described above for unloading chips; however, transport mechanism 150 is modified somewhat as hereinafter described. Because DIPS are secured within sockets due to frictional forces acting upon the leads which extend from the body portion of the DIP, the vacuum force supplied to pick-up head 210 for lifting and transporting chips is not alone sufficient to overcome those frictional forces and thereby remove the DIP from its socket. Accordingly, transport mechanism 150 is modified so as to include wedge member 250 and spacer block 252, spacer block 252 employed to attach wedge member 250 to the underside of delivery channel 192. Referring to FIGS. 9A, 9B, and 9C, wedge member 250 generally comprises a flat top portion 254 and a keel portion 256 rigidly affixed to the top portion at substantially a right angle such that the wedge member 250 has a "T-shaped" cross-section when a section is taken through the flat top portion 254. The width of top portion 254 narrows until it equals the thickness of keel portion 256 at 255, best shown in FIG. 9C. Wedge member 250 is tapered at angle of approximately 7 degrees from shoulder 258 to the end of wedge member 250, forming a tapered blade 260 ending in a point 262 at its foremost end, the end furthest from spacer block 252. Tapered blade 260 has the dimensions x and y shown in FIG. 9C where dimension x is approximately equal to 0.85 inches and dimension y is approximately equal to 0.46 inches. The height of wedge member 250 as measured at its untapered or highest point, "z" as shown in FIG. 9C, is dictated by the size of the DIP, dimension z being slightly greater than the depth of the groove formed in socket 14.

As shown in FIG. 9A, as table 106 and burn-in board 16 is moved toward transport device 150 in the forward direction 108, the frontmost or leading DIP 55 in socket 14 moves over point 260 and straddles the tapered blade 260 of wedge member 250. As table 106 continues to move forward, the leading edge of DIP 55 is raised or cammed upward by the action of its forward motion along the tappered blade 260. As table 106 and burn-in board 16 continue their forward motion so as to position DIP 55 directly beneath pick-up head 210, shoulder 258 of wedge member 250 moves under DIP 55 to a position approximately at the midpoint of DIP 55. By this time, DIP 56 has moved over and now straddles the foremost end of the tapered blade 260 of wedge member 250. While in this position, vertical cylinder 214 is actuated so as to extend piston rod 220 and pick-up head 210 toward their lowermost positions. With the right or leading end of DIP 55 pried from socket 14 to a greater extent than its left or trailing end by tapered blade 260, pick-up head 210 first contacts the leading end of DIP 55. As piston 220 continues its downward stroke, the force of pick-up head 210 against the leading end of DIP 55 extracts the left or trailing end of DIP 55 such that the upper surface of DIP 50 is now substantially parallel to the lower surface of pick-up head 210 and such that both ends of DIP 55 are extracted from socket 14 to an equal extent. It should be understood, however, that at this point DIP 50 is still secured within socket 14 by frictional forces. In this position, the vacuum to pick-up head 210 is actuated, the vacuum force now being sufficient to extract DIP 55 entirely from its socket 14. Cylinders 214 and 216 are then actuated so as to transport DIP 55 to the delivery channel 190 in the same manner as chips are transported from burn-in board 16 to delivery channel 190 as described above.

TESTING OF IC SOCKETS

The present invention is also adaptable for use in performing functional tests on sockets mounted on burn-in boards so as to ensure that if an IC package is loaded into the socket, the package will be properly exercised when it undergoes the burn-in process previously described.

In the testing configuration, platform 30 is maintained in the horizontal position shown in FIG. 1. Test-head 400, shown in FIG. 11, threadedly engages piston rod 410 extending from a vertically mounted air cylinder (not shown), the air cylinder being supported by a support bracket (not shown) which is clamped to lateral cross bars 41. Test-head 400 comprises a body portion 402 and a plurality of electrical leads 404 for making electrical connection with the electrical contacts in the IC socket to be tested. Leads 404 are electrically connected with in test-head 400 to conductors 406 which communicate electrical signals between the IC sockets to be tested and microprocessor 300.

In the testing mode, test-head 400 is positioned above burn-in board 16 over the first row of sockets 14 to be tested. Microprocessor 300 then actuates the air cylinder so as to extend piston rod 410 to its fully extended position, leads 404 thereby making electrical contact with the electrical contacts in socket 14. As should be apparent, test-heads 400 may differ in number of contacts and contact configuration in accordance with the type, size and configuration of socket being tested.

Once sockets in the first row on burn-in board 16 have been tested and their test performance recorded by microprocessor 300, table 106 is advanced, in this example, in the forward direction 108 by table carriage 92 so as to bring sockets in the next row on burn-in board 16 beneath test-head 400. In this stepwise fashion previously described, all the sockets on the burn-in board may be tested.

While a preferred embodiment of the invention has been shown and described, modifications thereof can be made by one skilled in the art without departing from the spirit of the invention.

What is claimed is:

1. An apparatus for loading IC packages into and unloading IC packages from sockets mounted on printed circuit boards, comprising:
   means for supporting the printed circuit boards in a substantially horizontal position and for rotating the printed circuit boards in both the clockwise and the counterclockwise direction from the substantially horizontal position to a plurality of inclined positions;
   means affixed to said supporting and rotating means for inserting IC packages into and extracting IC packages from sockets on printed circuit boards; and
   means affixed to said inserting and extracting means for delivering IC packages to and from said inserting and extracting means.

2. An apparatus according to claim 1 further comprising means for positioning the printed circuit boards beneath said inserting and extracting means.

3. Apparatus according to claim 1 further comprising a control system for receiving input signals form and communicating output signals to said apparatus.

4. Apparatus according to claim 1 wherein said delivery means comprises a delivery track for delivering IC packages to and from said transport means in a serial fashion.

5. Apparatus according to claim 4 wherein said delivery means includes a gate mechanism for delivering IC packages to and from said transport means one IC package at a time.

6. An apparatus according to claim 1 wherein said means for inserting and extracting comprises:
   a vacuum source;
   a pick-up head actuatable by said vacuum source for lifting IC packages;
   a first cylinder assembly having a piston rod extending therefrom attached to said pick-up head so as to lower said pick-up head to a position in close proximity of an IC package and to raise the IC package after said pick-up head has been actuated by said vacuum source; and
   a second cylinder assembly having a piston rod extending therefrom and affixed to said first cylinder assembly so as to move said first cylinder assembly and said pick-up head alternately between a position above said delivery means and a position above the printed circuit boards.

7. An apparatus for loading IC packages into and unloading IC packages from sockets mounted on one or more burn-in boards, comprising;
   a rotatable platform, said platform rotatable about its axis from a substantially horizontal position in both a first direction and a second direction opposite the first direction;
   a table movably affixed to aid platform for supporting the burn-in boards, said table movable in the forward, rearward, and lateral directions;
   a plurality of loader/unloader mechanisms affixed to said platform above said table for inserting IC packages into and extracting IC packages from sockets on the burn-in boards;
   means attached to said loader/unloader mechanisms for delivering IC packages to said loader/unloader mechanisms when said platform is rotated in a first direction and for delivering IC packages from said loader/unloader mechanisms when said platform is rotated in a second direction opposite the first direction.

8. Apparatus according to claim 7 further comprising a control system for receiving input signals from and communicating output signals to said apparatus.

9. Apparatus according to claim 7 wherein said delivery means comprise a delivery track for delivering IC packages to and from said loader/unloader mechanisms in a serial fashion.

10. Apparatus according to claim 9 further comprising a gate mechanism for delivering IC packages to and from said loader/unloader mechanisms one package at a time.

11. Apparatus according to claim 10 wherein said delivery means includes a clamping device for securing an IC package storage tube to said delivery track so as to allow IC packages to slide between said delivery track and the IC package storage tubes.

12. Apparatus according to claim 7 wherein said loader/unloader mechanism comprises:
   a vacuum source;
   a pick-up head actuatable by said vacuum source for lifting IC packages;
   a first cylinder assembly having a piston rod extending therefrom attached to said pick-up head so as to lower said pick-up head to a position in close proximity of an IC package and to raise the IC package after said pick-up head has been actuated by said vacuum source;
   a second cylinder having a piston rod extending therefrom and affixed to said first cylinder assembly so as to move said first cylinder assembly and said pick-up head alternately between a position above said delivery channels and a position above burn-in boards.

13. An apparatus for receiving IC packages from storage tubes and loading the IC packages into sockets on one or more burn-in boards and for unloading IC packages from sockets on burn-in boards and delivering them to storage tubes, comprising:
   a frame;
   a platform supported on said frame and rotatable about its axis in both a first direction and a second direction opposite of the first direction;

a table movably affixed to aid platform for supporting the burn-in boards, said table movable in the forward, rearward, and lateral directions;

a plurality of loader/unloader mechanism affixed to said platform above said table for inserting IC packages into and removing IC packages from the IC package sockets;

means affixed to said loader/unloader mechanisms for gravity feeding IC packages to said loader/unloader mechanisms from the storage tubes when said platform is rotated in the first direction and for gravity feeding IC packages to the storage tubes from said loader/unloader mechanism when said platform is rotated in the second direction opposite of the first direction;

a plurality of gate mechanisms affixed to said gravity feeding means for limiting the passage of IC packages in said gravity feeding means to one IC package at a time;

a control system for receiving input signals from and communicating output signals to said apparatus.

14. Apparatus according to claim 13 wherein said gravity feeding means comprises a deliver channel, said delivery channel comprising:

a delivery track for delivering IC packages in serial fashion;

a track cover attached to said delivery track so as to retain the IC packages on said track; and a clamping device for securing IC package storage tubes to said delivery channels so as to allow IC packages to slide between said delivery track and the IC package storage tubes.

15. Apparatus according to claim 14 wherein said loader/unloader mechanism comprises:

a vacuum source;

a pick-up head actuable by said vacuum source for lifting IC packages;

a first cylinder assembly having a piston rod extending therefrom attached to said pick-up head so as to lower said pick-up head to a position in close proximity of an IC package and to raise the IC package after the pick-up head has been actuated by said vacuum source; and a second cylinder having a piston rod extending therefrom and affixed to said first cylinder assembly so as to move said first cylinder assembly and said pick-up head alternately between a position above said delivery track and a position above the burn-in boards.

16. Apparatus according to claim 15 wherein said control system includes detection means for monitoring the vacuum at said pick-up head so as to determine when an IC package has been secured to said pick-up head by actuation of said vacuum source.

17. The apparatus according to claim 13 further comprising means for rotating said platform in a first direction and in a second direction opposite the first direction.

18. An apparatus for receiving IC packages from IC packages storage tubes and loading the IC packages into sockets on burn-in boards and for unloading IC packages from sockets on burn-in and delivering them to storage tubes, comprising:

means for supporting the burn-in boards;

means on said support means for receiving the IC package storage tubes;

means on said support means for inserting IC packages into the sockets on burn-in boards and for extracting the IC packages from the sockets on the burn-in boards;

means for rotating said support means;

means on said support means for delivering IC packages between the IC package storage tubes and said inserting and extracting means when said support means is rotated.

19. An apparatus according to claim 18 wherein said support means comprises:

a platform; and a table movably affixed to said platform for supporting the burn-in boards, said table movable in the forward, rearward and lateral directions.

20. An apparatus according to claim 18 wherein said delivery means comprises:

a delivery track for delivering IC packages to and from said inserting and extracting means in serial fashion; and a gate mechanism affixed to said delivery track for delivering IC packages to and from said inserting and extracting means one IC package at a time.

21. An apparatus according to claim 20 wherein said inserting and extracting means comprises a plurality of loader/unloader mechanisms affixed to said support means, said loader/unloader mechanisms comprising:

a vacuum source;

a pick-up head actuable by said vacuum source for lifting IC packages;

a first cylinder assembly having a piston rod extending therefrom attached to said pick-up head so as to lower said pick-up head to a position in close proximity of an IC package and to raise the IC package after the pick-up head has been actuated by said vacuum source; and a second cylinder assembly having a piston rod extending therefrom and affixed to said first cylinder assembly so as to move said first cylinder assembly and said pick-up head alternately between a position above said delivery means and a position above the burn-in boards.

* * * * *